(12) United States Patent
Burns et al.

(10) Patent No.: US 7,100,772 B2
(45) Date of Patent: Sep. 5, 2006

(54) WAFER CONTAINER WITH DOOR ACTUATED WAFER RESTRAINT

(75) Inventors: John Burns, Colorado Springs, CO (US); Matthew A. Fuller, Colorado Springs, CO (US); Jeffery J. King, Colorado Springs, CO (US); Martin L. Forbes, Divide, CO (US); Mark V. Smith, Colorado Springs, CO (US)

(73) Assignee: Entegris, Inc., Chaska, MN (US)

( * ) Notice: Subject to any disclaimer, the term of this patent is extended or adjusted under 35 U.S.C. 154(b) by 0 days.

(21) Appl. No.: 10/989,232

(22) Filed: Nov. 15, 2004

(65) Prior Publication Data

US 2005/0109667 A1    May 26, 2005

Related U.S. Application Data

(60) Provisional application No. 60/520,817, filed on Nov. 16, 2003.

(51) Int. Cl.
*B65D 85/90* (2006.01)
(52) U.S. Cl. ...................................... 206/710; 206/711
(58) Field of Classification Search ........ 206/710–712, 206/454, 723, 832
See application file for complete search history.

(56) References Cited

U.S. PATENT DOCUMENTS

| | | | | |
|---|---|---|---|---|
| 4,043,451 A | * | 8/1977 | Johnson | 206/711 |
| 4,520,925 A | * | 6/1985 | Johnson | 206/711 |
| 5,253,755 A | * | 10/1993 | Maenke | 206/308.3 |
| 5,255,797 A | * | 10/1993 | Kos | 211/41.18 |
| 5,452,795 A | | 9/1995 | Gallagher et al. | |
| 5,555,981 A | * | 9/1996 | Gregerson | 206/711 |
| 5,711,427 A | * | 1/1998 | Nyseth | 206/710 |
| 5,782,362 A | * | 7/1998 | Ohori | 206/711 |
| 5,915,562 A | | 6/1999 | Nyseth et al. | |
| 6,003,674 A | * | 12/1999 | Brooks | 206/711 |
| 6,082,540 A | * | 7/2000 | Krampotich et al. | 206/445 |

FOREIGN PATENT DOCUMENTS

EP    0 735 572 B1    6/2002

* cited by examiner

*Primary Examiner*—Mickey Yu
*Assistant Examiner*—Jerrold Johnson
(74) *Attorney, Agent, or Firm*—Patterson, Thuente, Skaar & Christensen, P.A.

(57) ABSTRACT

A container for holding a wafer includes an enclosure portion having a top, a bottom, a pair of opposing sides, a back and an opposing open front defined by a door frame. A door is sealingly engagable in the door frame to close the open front. The container further includes wafer restraint means in the enclosure including fixed wafer restraint means and operable wafer restraint means. The operable wafer restraint means is selectively positionable by engaging and disengaging the door from the door frame, and is positioned so to enable insertion or removal of a wafer from the container when the door is disengaged from the door frame and positioned so as to cooperate with the fixed wafer restraint means to restrain the wafer in the container when the door is engaged in the door frame.

18 Claims, 4 Drawing Sheets

WAFER CONTAINER WITH DOOR ACTUATED WAFER RESTRAINT

RELATED APPLICATIONS

This application claims the benefit of U.S. Provisional Patent Application Ser. No. 60/520,817, filed Nov. 16, 2003, hereby fully incorporated herein by reference.

FIELD IF THE INVENTION

This application relates to sealable wafer containers, and more specifically to wafer support and restraining means in wafer containers.

BACKGROUND OF THE INVENTION

Semiconductor wafers have become larger in scale, now with fabrication facilities commonly utilizing 300 mm wafers to be manufactured into semiconductor devices such as integrated circuits. The integrated circuits themselves have become larger in size with increasing circuit densities. As a consequence, the size of particulate contaminants that can destroy a circuit have decreased significantly, and strict particulate control is necessary during all phases of manufacturing, processing, transporting, and storage of semiconductor wafers.

In order to inhibit contamination by particulates during storage, processing, and handling operations, wafers are commonly stored and transported in sealed front-opening wafer containers that have a door secured by latches on the open front. The door can be typically removed manually or robotically. Such wafer containers are known in the industry as FOUPs, which is an acronym for front-opening unified pod, and FOSBs, an acronym for front-opening shipping box. Examples of such containers are generally disclosed in U.S. Pat. Nos. 6,644,477; 6,267,245; 6,216,874; 6,206,196; 6,010,008; and 5,944,194, all of which are commonly owned by the owners of the present invention and which are hereby fully incorporated herein by reference.

The doors on these types of containers are operated with robotic interfaces that have precisely positioned keys that insert into the front of the door to operate latching mechanisms to remove and place the door with respect to the container portion.

Semiconductor wafers are typically very thin and brittle. As a consequence, it is highly desirable wafers are firmly restrained in the container to inhibit movement. Further, the wafers should be cushioned against shocks that may cause breakage of the wafer.

Prior art containers typically have one or more wafer cushioning support or restraint structures fixed in the enclosure. These fixed structures may be supplemented by one or more wafer cushions fixed on the door, which provide support to the wafers when the door is engaged with the container. Most commonly, two fixed supports are spaced apart in the enclosure and one support is provided on the door so that wafers are supported at three roughly evenly spaced-apart locations.

While prior containers are generally satisfactory for most uses, it is desirable in some cases, particularly in wafer containers for single wafers, to provide additional support along the edge of the wafer facing the door to alleviate unsatisfactory deflection and movement of the wafer. What is needed in the industry is an alternative wafer cushioning means that enables firm support and cushioning along the front edge of a wafer.

SUMMARY OF THE INVENTION

The present invention meets the need of the industry for a wafer container with alternative wafer cushioning means that enables firm support and cushioning along the front edge of a wafer. According to an embodiment of the invention a container for holding a wafer includes an enclosure portion having a top, a bottom, a pair of opposing sides, a back and an opposing open front defined by a door frame. A door is sealingly engagable in the door frame to close the open front. The container further includes wafer restraint means in the enclosure including fixed wafer restraint means and operable wafer restraint means. The operable wafer restraint means is selectively positionable by engaging and disengaging the door from the door frame, and is positioned so to enable insertion or removal of a wafer from the container when the door is disengaged from the door frame and positioned so as to cooperate with the fixed wafer restraint means to restrain the wafer in the container when the door is engaged in the door frame.

In one embodiment, the wafer restraint means includes a generally c-shaped wafer support having a pair of opposing branches, each branch having a first end fixedly coupled to the back of the enclosure portion and a second opposing end cantilevered therefrom. Each branch includes a forward wafer engaging portion proximate the second end, and the wafer restraint system further includes an actuator disposed so as to engage and urge the second ends of the branches inwardly when the door is engaged with the enclosure portion.

In another embodiment of the invention, the operable wafer restraint means includes an arm pivotally coupled with the enclosure portion. The arm may include a first end having a door contacting portion and a second opposing end having a wafer contacting portion. The arm may further have a spring operably coupled between the enclosure portion and the arm for biasing the arm toward the first position.

DETAILED DESCRIPTION OF THE PREFERRED EMBODIMENTS

Figure 1:
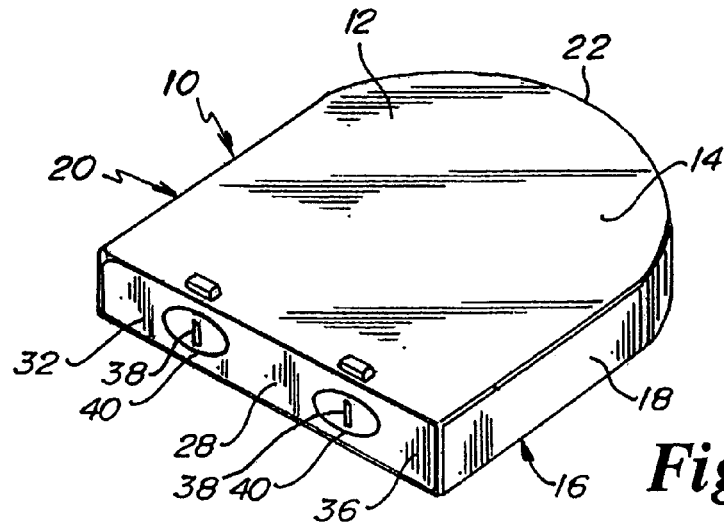
FIG. 1 is a perspective view of a front-opening wafer container for holding a single wafer.
Figure 2:
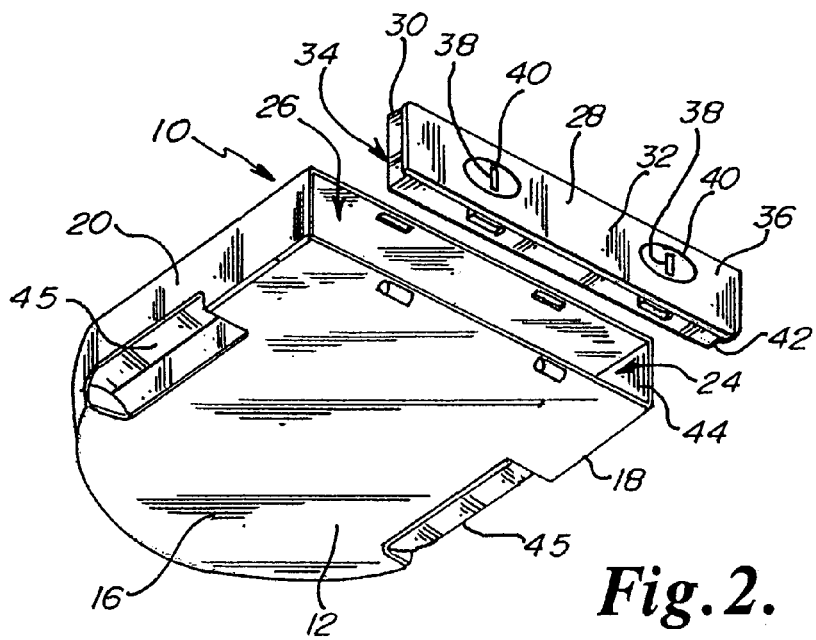
FIG. 2 is a perspective view of an alternative embodiment of a front-opening wafer container for holding a single wafer.

Referring to FIGS. 1 and 2, a front opening wafer container 10 for holding a single wafer according to embodiments of the invention generally includes an enclosure portion 12, having a top 14, a bottom 16, a pair of opposing sides 18, 20, a back 22 and an open front 24, enclosing an open interior 26. Wafer container 10 further generally includes door 28 for sealingly closing open front 24. Door 28 generally includes chassis 30 having a front or exterior side 32, and a back or interior side 34. Front side 32 includes panel 36 covering one or more latching mechanisms 38, which are operated through keyholes 40 defined in panel 36. Further details of latching mechanisms 38 are disclosed in co-pending U.S. Utility patent application Ser. No. 10/988,933, entitled WAFER CONTAINER AND DOOR WITH CAM LATCHING MECHANISM, filed on the same day as the present application and hereby fully incorporated herein by reference. Sealing means (not depicted) may be provided at periphery 42 of door 28 to sealingly engage with door frame 44 in enclosure portion 12.

Figure 3:
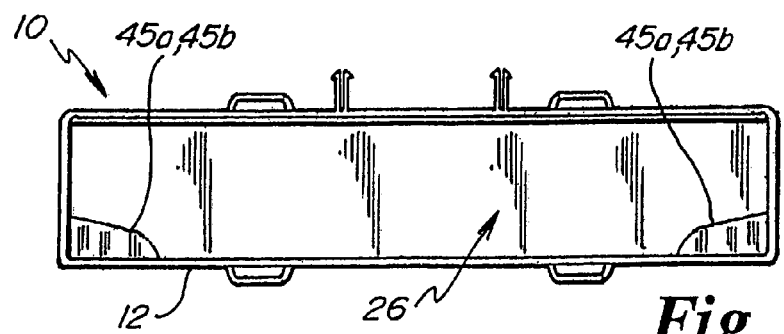
FIG. 3 is a front elevation view of the wafer container of FIG. 2 with the door removed.

In the embodiment of FIGS. 2 and 3, hand grips 45 are provided on the exterior of enclosure portion 12 to enable the container 10 to be easily handled. The interior surface 45a of these hand grips 45 may double as a fixed wafer support surface 45b in the container 10.

Figure 4:
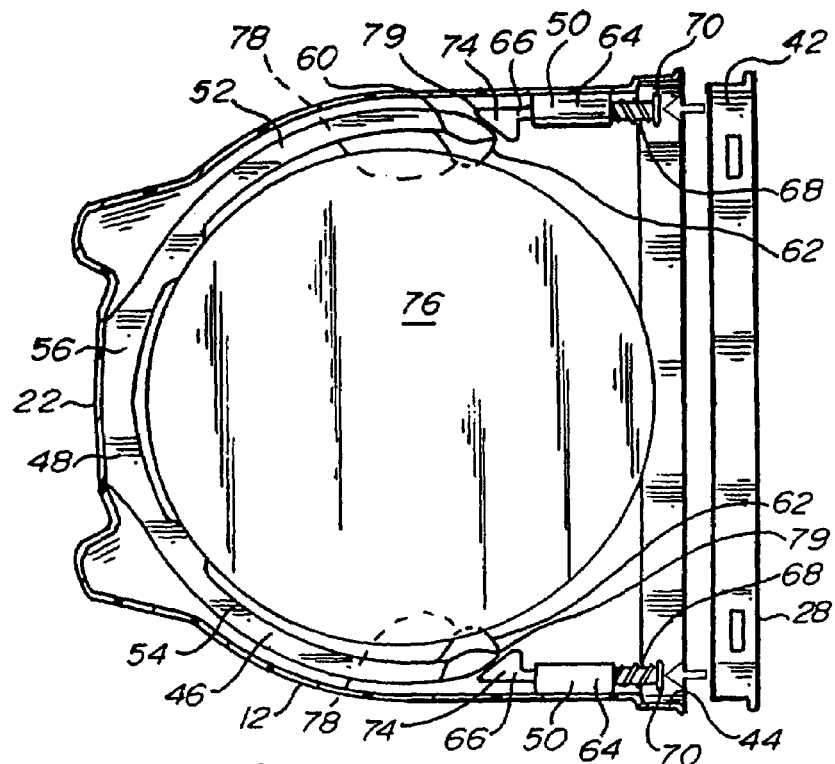
FIG. 4 is a sectional view of an embodiment of a wafer container with a door actuated operable wafer restraint according to the invention with the door disengaged from the enclosure.
Figure 5:
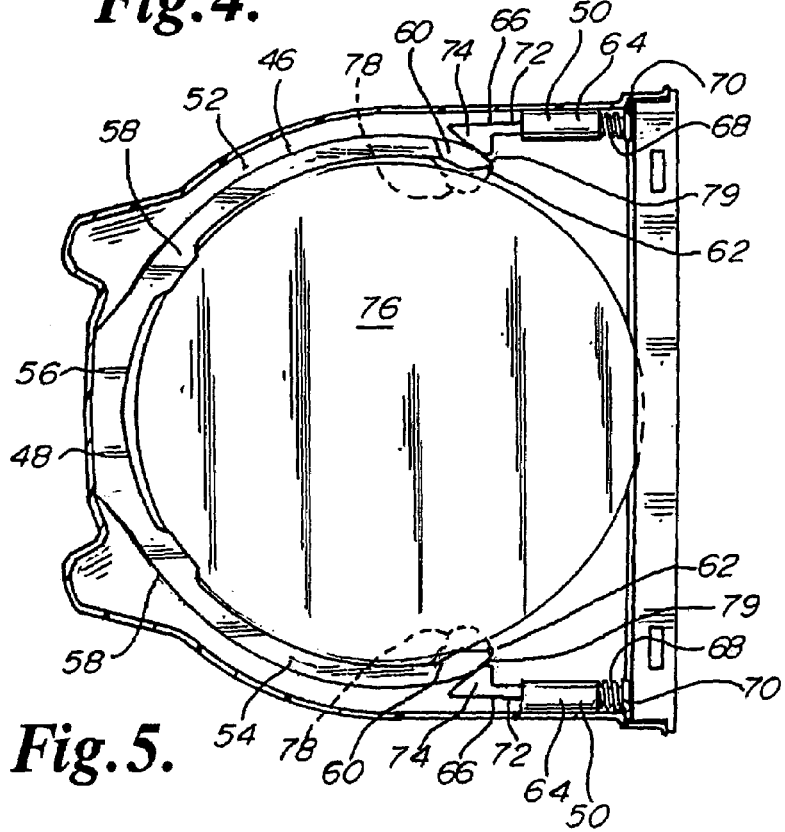
FIG. 5 is a sectional view of the wafer container of FIG. 4 with the door fully engaged with the enclosure.

According to an embodiment of the invention depicted in FIGS. 4 and 5, wafer support and restraint system 46 is positioned in enclosure portion 12, and generally includes wafer support 48 and actuator mechanism 50. Wafer support 48 is generally c-shaped when viewed in plan view as depicted, and includes a pair of branches 52, 54, extending from attachment portion 56, which is fixed to the interior surface of back 22 of enclosure portion 12 so that branches 52, 54, are cantilevered therefrom. Each branch 52, 54 has a rear wafer engaging portion 58 positioned proximate attachment portion 56 and a forward wafer engaging portion 60 positioned proximate the distal end 62 of each branch.

Actuator mechanism 50 generally includes guide 64, piston 66, and return spring 68. Guide 64 defines a bore (not depicted) in which piston 66 is slidably disposed. Piston 66 generally includes head 70, intermediate shaft 72 and wedge-shaped support engaging portion 74. Return spring 68 is disposed between guide 64 and head 70.

In operation, wafer 76 may be inserted in enclosure portion 12 with door 28 removed so that the wafer is engaged with rear wafer engaging portions 58 of each branch 52, 54. With door 28 not engaged with enclosure portion 12 as depicted in FIG. 4, distal ends 62 of branches 52, 54, are spread outward slightly away from wafer 76 so that only the inner tips 78 of forward wafer engaging portions 60 are engaged under wafer 76. In this position, wafer 76 is not restrained from moving toward open front 24.

As door 28 is engaged with enclosure portion 12 in the direction of the arrows as depicted in FIG. 4, interior side 34 of door 28 engages head 70 of each piston 66. As door 28 is moved into engagement in door frame 44, pistons 66 slide in guides 64 inwardly into enclosure portion 12, and return springs 68 are compressed as heads 70 move toward guides 64. As pistons 66 move further inward, wedge shaped support engaging portions 74 engage sloped outer edge 79 of branches 52, 54, forcing distal ends 62 toward wafer 76, and engaging forward wafer engaging portions 58 around wafer 76. In the fully engaged position depicted in FIG. 5, wafer 76 is restrained from moving toward open front 24 by forward wafer engaging portions 58.

Door 28 may be disengaged from enclosure portion 12 whenever it is desired to remove wafer 76 from the container. As door 28 is moved out of door frame 44, return springs 68, decompress, urging heads 70 outward away from guides 64 and returning pistons 66 to the position depicted in FIG. 4. In turn, as wedge shaped support engaging portions 74 disengage from sloped outer edge 78 of branches 52, 54, distal ends 62 and forward wafer engaging portions 58 spring outward away from wafer 76 returning to the position depicted in FIG. 4.

As an alternative to actuator mechanism 50, a structure similar to piston 66 may be fixed directly to door 28 at the appropriate location to engage sloped outer edge 79 of branches 52, 54, so as to deflect distal ends 62 inwardly as door 28 is engaged with enclosure portion 12 as described above. While requiring relatively greater precision in aligning door 28 with the container during engagement, this embodiment offers the advantage of an actuator without moving parts.

Figure 6:
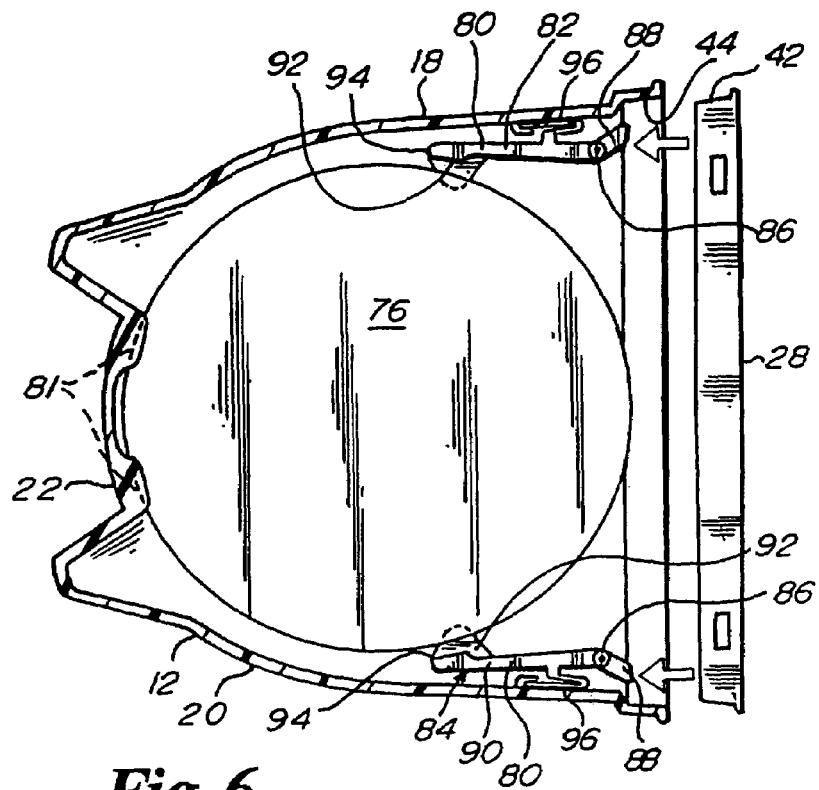
FIG. 6 is a sectional view of an alternative embodiment of a wafer container with a door actuated operable wafer restraint according to the invention with the door disengaged from the enclosure.
Figure 7:
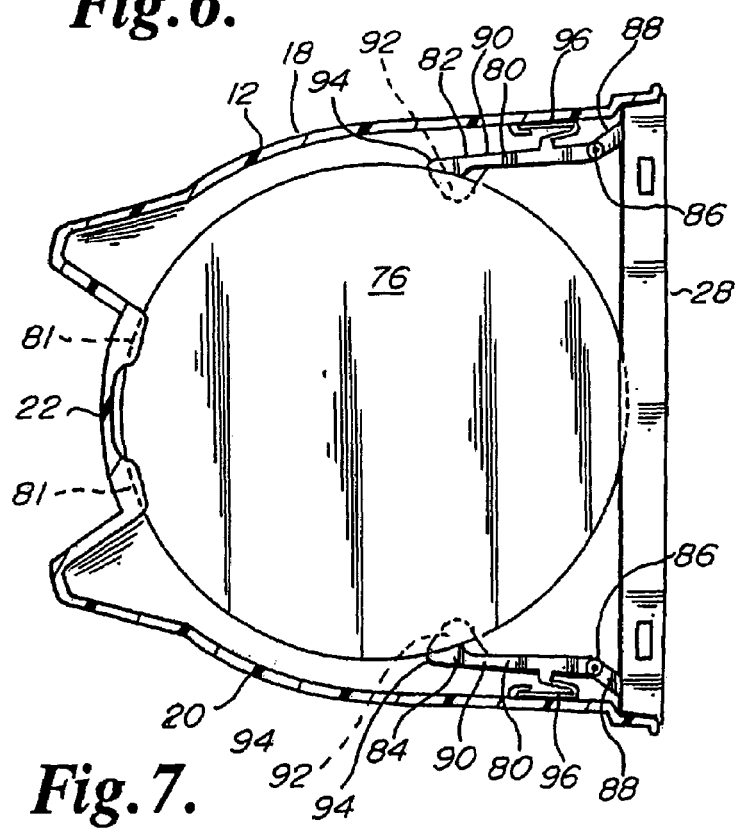
FIG. 7 is a sectional view of the wafer container of FIG. 6 with the door fully engaged with the enclosure.

Another alternative embodiment of the invention is depicted in FIGS. 6 and 7. In this embodiment, wafer support and restraint system 80 generally includes a pair of fixed rear wafer supports 81 on back 22 of enclosure portion 12 and a pair of operable forward wafer supports 82, 84. Each forward wafer support 82, 84, is pivotally mounted to enclosure 12 at pivot 86, and generally includes door engaging portion 88 and arm 90 on opposite sides of pivot 86. Arm 90 has wafer engaging portion 92 at distal end 94. Springs 96 are coupled between each arm 90 and sides 18, 20, to locate arm 90 in the proper position for insertion of wafer 76 when door 28 is removed from the container, and to provide a biasing force tending to pull arm 90 toward the sides 18, 20, when distal ends 94 are moved inward toward wafer 76. Door 28 may have a pad 98 thereon for receiving door engaging portion 88.

In operation, wafer 76 may be inserted in enclosure portion 12 with door 28 removed so that the wafer is engaged with rear wafer supports 80. With door 28 not engaged with enclosure portion 12 as depicted in FIG. 6, distal ends 94 of each arm 90 are positioned proximate sides 18, 20, so as not to interfere with insertion or removal of the wafer. In this position, wafer 76 is not restrained from moving toward open front 24.

As door 28 is engaged with enclosure portion 12 in the direction of the arrows as depicted in FIG. 6, pads 98 on door 28 engage door engaging portions 88 of each forward wafer support 82, 84. As door 28 is moved into engagement in door frame 44, door engaging portions 88 are forced outwardly toward sides 18, 20, causing forward wafer supports 82, 84 to pivot about pivots 86, and distal ends 94 of arms 90 to move inwardly. Wafer engaging portions 92 engage around wafer 76 as door 28 reaches the fully engaged position depicted in FIG. 7. In this fully engaged position depicted in FIG. 7, wafer 76 is restrained from moving toward open front 24 by wafer engaging portions 92.

Again, door 28 may be disengaged from enclosure portion 12 whenever it is desired to remove wafer 76 from the container. As door 28 is moved out of door frame 44, pads 98 disengage from door engaging portions 88, enabling forward wafer supports 82, 84, to pivot about pivot 86 and springs 96 to decompress, thereby pulling arms 90 toward sides 18, 20, away from wafer 76. Hence, wafer support and restraint system 80 returns to the position depicted in FIG. 4.

Figure 8:
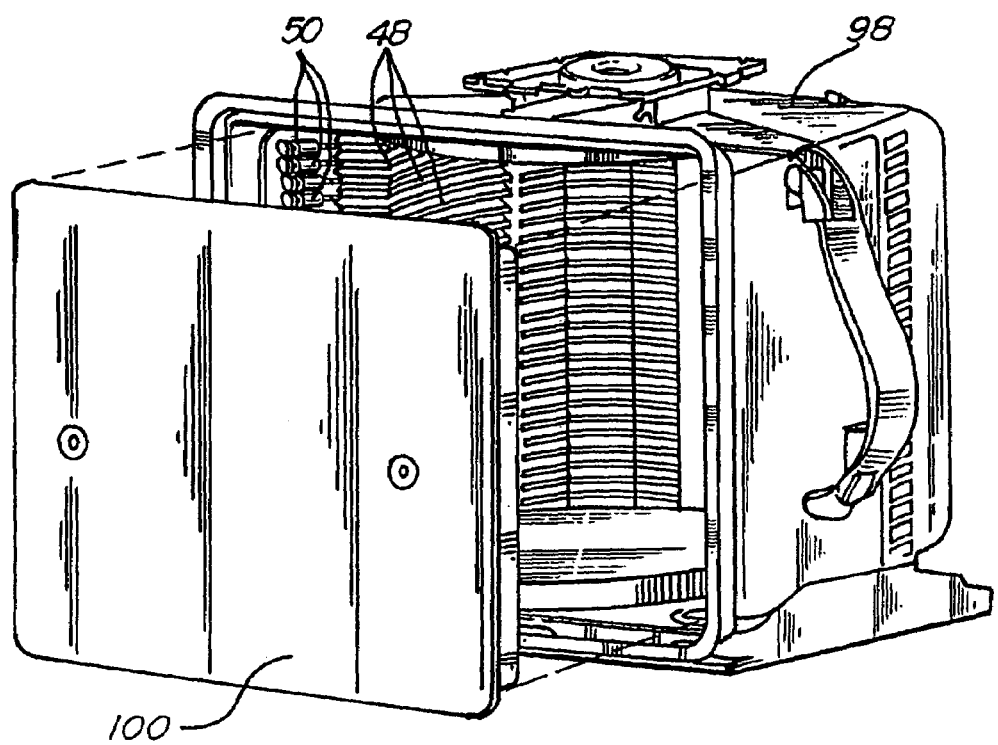
FIG. 8 is a perspective view of a wafer container for multiple wafers with door actuated operable wafer restraints according to the invention.

As depicted in FIG. 8, the present invention may be applied to provide additional support to the front edge of wafers in a multiple wafer container. In the depicted embodiment, a plurality of the cantilevered c-shaped wafer supports 48 described hereinabove is positioned in the container 98, one for each wafer to be held. A plurality of actuating mechanisms 50 is positioned along the sides of the container 98 to actuate the wafer supports 48 when door 100 is engaged with the container. It will be appreciated that the alternative embodiment depicted in FIGS. 6 and 7 may be employed in a multiple wafer carrier in a like manner within the scope of the invention.

Various components identified herein may be molded from suitable thermoplastic or other material having characteristics suitable for use in wafer containers. Desirable thermoplastics would include polyetheretherketone (PEEK) with carbon fiber filler or carbon powder filler, polyetherimide (PEI), polycarbonate or other suitable thermoplastics as are generally known in the art.

What is claimed is:

1. The combination of a wafer and a container for holding the wafer wherein the container comprises:
    an enclosure portion having a top, a bottom, a pair of opposing sides, a back and an opposing open front defined by a door frame;
    a door sealingly engagable in the door frame to close the open front; and
    a wafer restraint system in the enclosure comprising at least one fixed wafer restraint portion and at least one operable wafer restraint portion, the operable wafer restraint portion being selectively shiftable with the door between a first position wherein the operable wafer restraint portion is positioned to enable the wafer to be inserted and removed from the container, and a second position wherein, when the wafer is received in the fixed wafer restraint portion, the operable wafer restraint portion is engaged with and restrains the wafer, the wafer restraint system including a generally c-shaped wafer support having a pair of opposing branches, each branch having a first end fixedly coupled to the back of the enclosure portion and a second opposing end cantilevered therefrom, each branch further including a forward wafer engaging portion proximate the second end, the wafer restraint system further including an actuator disposed so as to engage and urge the second ends of the branches inwardly when the door is engaged with the enclosure portion.

2. The combination of claim 1, wherein the actuator comprises a guide operably coupled with the enclosure portion and a piston slidably disposed in the guide.

3. The combination of claim 2, wherein the piston includes a head portion disposed so as to be engagable with the door and wherein the actuator further comprises a return spring disposed to exert a biasing force resisting movement of the head portion toward the guide.

4. The combination of claim 3, wherein the piston includes a wedge shaped wafer support engaging portion opposite the head.

5. The combination of claim 1, wherein the actuator comprises a projection on the door.

6. The combination of claim 1, wherein the operable wafer restraint portion comprises an arm pivotally coupled with the enclosure portion.

7. A container for holding a wafer comprising:
    an enclosure portion having a top, a bottom, a pair of opposing sides, a back and an opposing open front defined by a door frame;
    a door sealingly engagable in the door frame to close the open front;
    a wafer restraint system in the enclosure including a generally c-shaped wafer support having a pair of opposing branches, each branch having a first end fixedly coupled to the back of the enclosure portion and a second opposing end cantilevered therefrom, the branches positioned so to enable insertion or removal of a wafer from the container when the door is disengaged from the door frame, each branch further including a forward wafer engaging portion proximate the second end, the wafer restraint system further including means for urging the second ends of the branches inwardly when the door is engaged with the enclosure portion.

8. The container of claim 7, wherein the means for urging the second ends of the branches inwardly when the door is engaged with the enclosure portion includes an actuator.

9. The container of claim 8, wherein the actuator comprises a guide operably coupled with the enclosure portion and a piston slidably disposed in the guide.

10. The container of claim 9, wherein the piston includes a head portion disposed so as to be engagable with the door and wherein the actuator further comprises a return spring disposed to exert a biasing force resisting movement of the head portion toward the guide.

11. The container of claim 10, wherein the piston includes a wedge shaped wafer support engaging portion opposite the head.

12. The container of claim 8, wherein the actuator comprises a projection on the door.

13. The combination of a plurality of wafers and a container for holding the wafers in an axially aligned, generally parallel spaced apart arrangement, the container comprising:
    an enclosure portion having a top, a bottom, a pair of opposing sides, a back and an opposing open front defined by a door frame;
    a door sealingly engagable in the door frame to close the open front; and
    a wafer restraint system in the enclosure comprising a plurality of fixed wafer restraint portions and a plurality of corresponding operable wafer restraint portions, the operable wafer restraint portions being selectively shiftable with the door between a first position wherein the operable wafer restraint portions are positioned to enable the wafers to be inserted and removed from the container, and a second position wherein, when the wafers are received in the fixed wafer restraint portions, the operable wafer restraint portions are engaged with and restraining the wafers, the wafer restraint system including a plurality of generally c-shaped wafer supports having a pair of opposing branches, each branch having a first end fixedly coupled to the back of the enclosure portion and a second opposing end cantilevered therefrom, each branch further including a forward wafer engaging portion proximate the second end, the wafer restraint system further including an actuator for each branch disposed so as to engage and urge the second ends of the branches inwardly when the door is engaged with the enclosure portion.

14. The combination of claim 13, wherein each actuator comprises a guide operably coupled with the enclosure portion and a piston slidably disposed in the guide.

15. The combination of claim 14, wherein each piston includes a head portion disposed so as to be engagable with the door and wherein each actuator further comprises a return spring disposed to exert a biasing force resisting movement of the head portion toward the guide.

16. The combination of claim 15, wherein the piston includes a wedge shaped wafer support engaging portion opposite the head.

17. The combination of claim 13, wherein each actuator comprises a projection on the door.

18. The combination of claim 13, wherein the operable wafer restraint portions comprise an arm pivotally coupled with the enclosure portion.

* * * * *